(12) United States Patent
Kim et al.

(10) Patent No.: US 10,752,737 B2
(45) Date of Patent: *Aug. 25, 2020

(54) TOUCH SENSITIVE ELEMENT AND DISPLAY DEVICE COMPRISING THE SAME

(71) Applicant: LG Display Co., Ltd., Seoul (KR)

(72) Inventors: TaeHeon Kim, Seoul (KR); YongSu Ham, Seoul (KR); YongWoo Lee, Goyang-si (KR); KyungYeol Ryu, Goyang-si (KR); YuSeon Kho, Seoul (KR); MyungJin Lim, Goyang-si (KR); SeulGi Choi, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/798,000

(22) Filed: Feb. 21, 2020

(65) Prior Publication Data

US 2020/0207920 A1 Jul. 2, 2020

Related U.S. Application Data

(63) Continuation of application No. 15/820,205, filed on Nov. 21, 2017, now Pat. No. 10,611,883.

(30) Foreign Application Priority Data

Nov. 25, 2016 (KR) .......................... 10-2016-0158670

(51) Int. Cl.
*C08G 79/08* (2006.01)
*C07F 7/00* (2006.01)
(Continued)

(52) U.S. Cl.
CPC .............. *C08G 79/08* (2013.01); *C07F 7/00* (2013.01); *C07F 15/0033* (2013.01);
(Continued)

(58) Field of Classification Search
CPC ...... C08G 79/00; C08G 79/08; C09D 185/04; G06F 3/041; G06F 3/0412; G06F 3/044; G06F 2203/04103
See application file for complete search history.

(56) References Cited

U.S. PATENT DOCUMENTS 10,611,883 B2 * 4/2020 Kim .......................... C07F 7/00
2011/0192016 A1 8/2011 Kang et al.
(Continued)

FOREIGN PATENT DOCUMENTS

CN 102893369 A 1/2013
CN 204 946 934 U 1/2016
(Continued)

OTHER PUBLICATIONS

Extended European Search Report dated Apr. 24, 2018 in counterpart application EP 17 20 1577.8.
(Continued)

*Primary Examiner* — Sophie Hon
(74) *Attorney, Agent, or Firm* — Polsinelli PC

(57) ABSTRACT

Provided are a touch sensitive element and a display device including the same. The touch sensitive element according to an exemplary aspect of the present disclosure includes an electroactive layer formed of a linear boron nitride polymer and an electrode disposed on at least one surface of the electroactive layer. Therefore, a piezoelectricity of the electroactive layer is improved to improve vibration strength of the touch sensitive element and significantly improve heat resistance.

25 Claims, 5 Drawing Sheets

PAB

(51) Int. Cl.
    *C08G 79/00*    (2006.01)
    *C09D 185/04*    (2006.01)
    *G06F 3/041*    (2006.01)
    *G06F 3/044*    (2006.01)
    *C07F 15/00*    (2006.01)

(52) U.S. Cl.
    CPC ........... *C08G 79/00* (2013.01); *C09D 185/04* (2013.01); *G06F 3/041* (2013.01); *G06F 3/044* (2013.01); *G06F 3/0412* (2013.01); *G06F 2203/04103* (2013.01)

(56) References Cited

U.S. PATENT DOCUMENTS

2013/0194084 A1    8/2013    Lacroix et al.
2016/0018927 A1    1/2016    Ding et al.

FOREIGN PATENT DOCUMENTS

| | | |
|---|---|---|
| EP | 0 278 734 A2 | 8/1988 |
| EP | 3 040 388 A1 | 7/2016 |
| GB | 2163761 A | 3/1986 |
| KR | 10-2012-0095889 A | 8/2012 |
| KR | 10-2013-0089211 A | 8/2013 |

OTHER PUBLICATIONS

Chinese Office Action dated Jun. 18, 2020 issued in corresponding Patent Application No. 201711132168.8 (6 pages).
Chinese Search Report dated Jun. 13, 2020 issued in corresponding Patent Application No. 201711132168.8 (2 pages).

\* cited by examiner

TOUCH SENSITIVE ELEMENT AND DISPLAY DEVICE COMPRISING THE SAME

CROSS-REFERENCE TO RELATED APPLICATION

This application is a continuation of U.S. patent application Ser. No. 15/820,205 filed on Nov. 21, 2017, which claims the priority of Korean Patent Application No. 10-2016-0158670 filed on Nov. 25, 2016, in the Korean Intellectual Property Office, the disclosure of which is incorporated herein by reference in its entirety.

BACKGROUND

Field of the Disclosure

The present disclosure relates to a display device, and more particularly, to a touch sensitive element, a display device including the same, and a manufacturing method thereof. Although the present disclosure is suitable for a wide scope of applications, it is particularly suitable for improving heat resistance and polarization intensity of a touch sensitive element and a display device including the same.

Description of the Background

Recently, in response to a demand of users who want to conveniently use various display devices including a liquid crystal display device and an organic light emitting display device, a touch type display device which a user touches a display device to input information is broadly used. Therefore, researches for utilizing a haptic device to provide direct and various touch feedbacks to the users have been continued. Typically, a haptic device of the related art is attached on a rear surface of a display panel, so that it is difficult to provide immediate and delicate feedback for the user's touch. Therefore, researches are actively performed to provide various and direct feedbacks, which are sensitive to the user's touch by positioning the haptic device on the display panel.

According to the related art, a vibration motor such as an eccentric rotating mass (ERM) or a linear resonant actuator (LRA) has been used for the display device as a haptic device. The vibration motor vibrates the entire display device. Therefore, there are problems in that a size of a mass needs to be increased in order to increase vibration strength. Inevitably, it is difficult to modulate a frequency to adjust the vibration level, and a response speed is very slow. Further, the eccentric rotating mass and the linear resonant actuator are formed of an opaque material so that it is difficult to dispose the eccentric rotating mass and the linear resonant actuator on the display panel.

In order to solve the above-described problems, a shape memory alloy (SMA) and electroactive ceramics (EAC) have been developed as a material for the haptic device. However, the shape memory alloy (SMA) has a slow response speed and a short life-span and is formed of an opaque material. Further, the electroactive ceramics is opaque and has a low durability against an external impact so that the electroactive ceramics can be easily broken due to the external impact. Further, it is difficult to make the electroactive ceramics thinner.

Therefore, recently, a haptic device technology using an electroactive polymer (EAP) is attracting attention. The electroactive polymer is a polymer which may be deformed by an electrical stimulation, so that it may be repeatedly expanded and contracted and bent by the electrical stimulation. As the electroactive polymer, a ferroelectric polymer and a dielectric elastomer may be used. Among this, as a ferroelectric polymer, a polyvinylidene fluoride (hereinafter, abbreviated as PVDF)-based polymer having a relatively high piezoelectricity draws an attention.

However, it is difficult to compose the PVDF-based polymer due to its high explosibility. Further, even though the PVDF-based polymer has a high piezoelectricity among the electroactive polymers, it has a problem in that a driving voltage is too high to be used for a mobile display and a heat resistance is too low.

SUMMARY

Accordingly, the present disclosure is to provide a touch sensitive element including an electroactive polymer which is easily composed and has a high intensity of polarization and excellent piezoelectricity and a display device including the same.

Further, the present disclosure is to provide a touch sensitive element in which heat resistance is improved to maintain a piezoelectricity even at a high temperature and a display device including the same.

The present disclosure is not limited to the above-mentioned aspects, which are not mentioned above, can be clearly understood by those skilled in the art from the following descriptions.

According to an aspect of the present disclosure, there is provided a touch sensitive element. The touch sensitive element includes an electroactive layer formed of a linear boron nitride polymer; and an electrode which is disposed on at least one surface of the electroactive layer. The touch sensitive element according to the aspect of the present disclosure has excellent vibration strength and improved heat resistance by the characteristics of the linear boron nitride polymer.

According to another aspect of the present disclosure, there is provided a touch sensitive element. The touch sensitive element includes an electroactive layer formed of a linear boron nitride polymer; and an electrode which is disposed on at least one surface of the electroactive layer in which a rate of change of a vibration acceleration measured at 110° C. with respect to a vibration acceleration measured at 25° C. is 50% or lower.

Other detailed matters of the exemplary aspects are included in the detailed description and the drawings.

According to the present disclosure, an electroactive polymer having a high intensity of polarization and excellent piezoelectricity is used to lower a driving voltage of a touch sensitive element.

Further, according to the present disclosure, heat resistance of the electroactive layer is improved so that the piezoelectricity of the electroactive layer may be maintained even at a high temperature.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
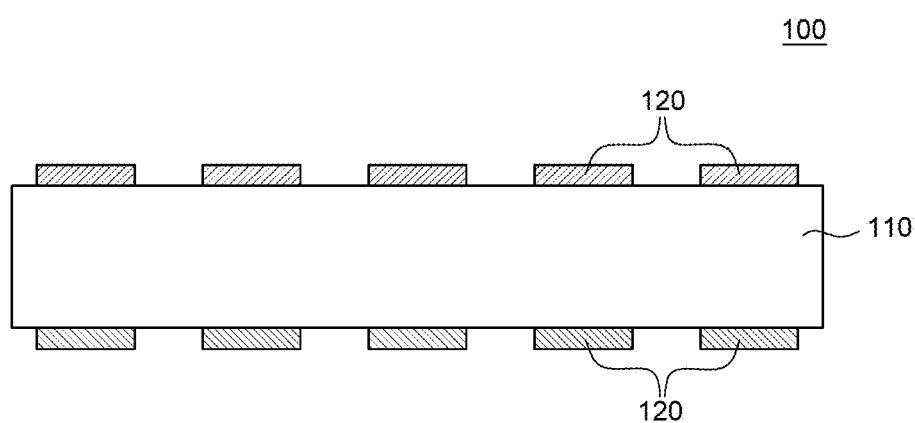
FIG. 1 is a schematic cross-sectional view illustrating a touch sensitive element according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely coupled to or combined with each other and can be interlocked and operated in technically various ways, and the aspects can be carried out independently of or in association with each other.

Hereinafter, various exemplary aspects of the present disclosure will be described in detail with reference to accompanying drawings.

Touch Sensitive Element

FIG. 1 is a schematic cross-sectional view illustrating a touch sensitive element according to an exemplary aspect of the present disclosure. Referring to FIG. 1, a touch sensitive element 100 according to an exemplary aspect of the present disclosure includes an electroactive layer 110 and an electrode 120.

Electrode

The electrode 120 applies an electric field to the electroactive layer 110 to induce vibration or bending by an electrical stimulation. The electrodes 120 may be disposed to have various shapes and various numbers of electrodes may be disposed as needed. For example, as illustrated in FIG. 1, a plurality of electrodes 120 may be disposed on an upper surface and a lower surface of the electroactive layer 110 or a plurality of electrodes may be disposed on one of the upper surface and the lower surface of the electroactive layer 110.

Specifically, the electrodes 120 may be disposed on both the upper surface and the lower surface of the electroactive layer 110. In this case, the electrode 120 disposed on the upper surface of the electroactive layer 110 extends in an X-axis direction and the electrode 120 disposed on the lower layer of the electroactive layer 110 extends in a Y axis direction to form a vertical arrangement structure in which the electrodes intersect each other to be disposed in a matrix form. Further, a horizontal arrangement structure in which the electrodes 120 are disposed on only one surface of the electroactive layer 110 may be formed. Further, the plurality of electrodes 120 is disposed to be opposite to each other on the upper surface and the lower surface of the electroactive layer 110 in one cell, so that a multilayer structure in which both the vertical arrangement structure and the horizontal arrangement structure of the electrode 120 are implemented may be formed.

The electrode 120 is formed of a conductive material. Further, in order to allow for light transmittance of the touch sensitive element 100, the electrode 120 may be formed of a transparent conductive material. For example, the electrode 120 may be formed of a transparent conductive material such as indium tin oxide (ITO), indium zinc oxide (IZO), graphene, metal nanowire, and transparent conductive oxide (TCO). Further, the electrode 120 may be formed of a metal mesh. That is, the electrode 120 is formed of a metal mesh in which a metal material is disposed to have a mesh type so that the electrode 120 may be configured to be substantially transparent. However, a constituent material of the electrode 120 is not limited to the above-described examples, but various transparent conductive materials may be used for the constituent material of the electrode 120. When the electrode 120 is formed of a plurality of electrodes, the electrode 120 may be formed of the same material or different materials.

The electrode 120 may be formed by various methods. For example, the electrode 120 may be formed on the electroactive layer 110 by a method such as sputtering, printing, and slit coating.

Electroactive Layer

The electroactive layer 110 may refer to a layer which can be deformed to generate vibration when a voltage is applied thereto. The electroactive layer 110 of the touch sensitive element 100 according to an exemplary aspect of the present disclosure may be formed of a linear boron nitride polymer.

The boron nitride polymer refers to a polymer in which a back bone is formed of boron and nitride. In this case, the linear boron nitride polymer refers to a boron nitride polymer in which back bones are connected in a straight line, differently from hexagonal boron nitride in which boron and nitride connected to the back bone form a hexagonal ring. More specifically, a typical boron nitride polymer has crystallinity by a hexagonal ring shape formed by boron and nitride and has a plurality of laminated planar structures or a nanotube structure. However, the linear boron nitride polymer has a structure in which a back bone extends in a straight line like a chain structure.

The linear boron nitride polymer has a high intensity of polarization. The linear boron nitride polymer has a high intensity of polarization due to a structural characteristic, as compared with the PVDF-based polymer which is a ferroelectric polymer used as the electroactive layer. Further, the linear boron nitride polymer has a high intensity of polarization also as compared with a hexagonal boron nitride having a planar structure or a nanotube structure. Specific description related therewith will be provided below with reference to FIGS. 2A to 2B and 3A to 3C.

For example, an intensity of polarization of the linear boron nitride polymer may be from 0.2 C/m² to 0.3 C/m² or higher, but is not limited thereto.

The electroactive layer 110 formed of a linear voron notride polymer of the touch sensitive element 100 according to an exemplary aspect of the present disclosure has a high intensity of polarization. Therefore, the electroactive layer 110 of the touch sensitive element 100 has an excellent piezoelectricity.

Specifically, referring to the following Equation 1, a force of the touch sensitive element 100, that is, vibration strength of the touch sensitive element 100 is proportional to a piezoelectric constant $d_{33}$ of the electroactive layer 110. Further, referring to the following Equation 2, the piezoelectric constant $d_{33}$ of the electroactive layer 110 is proportional to an intensity of polarization P of a material which configures the electroactive layer 110. Therefore, as the intensity of polarization of a material which configures the electroactive layer 110 is improved, the vibration strength of the touch sensitive element 100 is also improved.

$$F \propto N = \left(\frac{S}{L}\right) Y d_{33} V \quad \text{[Equation 1]}$$

$$d_{33} = 2Q_{11}\varepsilon_0\varepsilon_{33}P_3 \quad \text{[Equation 2]}$$

(F: force of an electric sensitive element, N: a number of laminations of the electroactive layer 110, S: a cross-sectional area of the electroactive layer 110, L: a length of the electroactive layer 110, Y: Young Modulus, Q11: a quantity of charge, $d_{33}$: a piezoelectric constant, ε0: permittivity in vacuum, ε33: permittivity, $P_3$: an intensity of polarization)

The linear boron nitride polymer of the present disclosure has a higher intensity of polarization than the PVDF-based polymer, which is used as the electroactive polymer. This will be described in more detail with reference to FIGS. 2A and 2B.

Figure 2A:
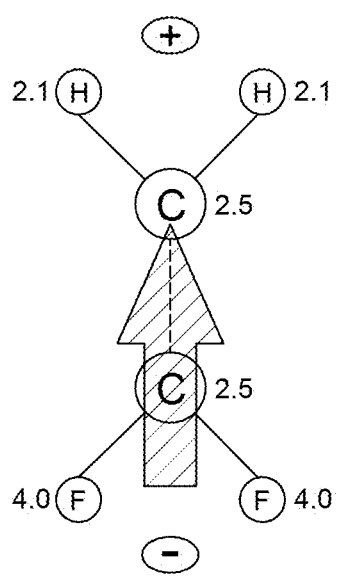
FIGS. 2A and 2B are schematic views respectively illustrating an intensity of polarization of a polyvinylidene fluoride-based polymer and a linear boron nitride polymer.
Figure 2B:
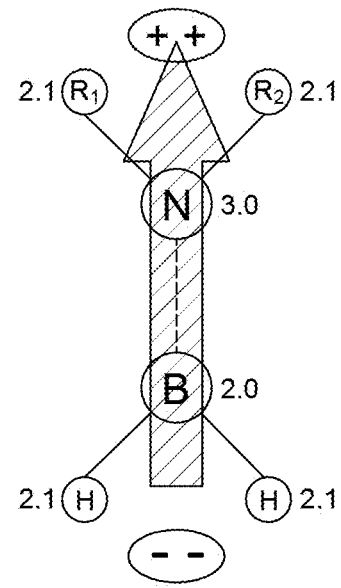

FIGS. 2A and 2B are schematic views illustrating an intensity of polarization of a polyvinylidene fluoride-based polymer and a linear boron nitride polymer. Specifically, FIG. 2A illustrates an intensity of polarization which acts on a back bone in one repeating unit composing the PVDF-based polymer which is a ferroelectric polymer and FIG. 2B illustrates an intensity of polarization which acts on a back bone in one repeating unit composing the linear boron nitride polymer. In this case, the number represented next to an atom is an electronegativity of each atom.

Generally, the intensity of polarization is defined by a sum of dipole moments. In the case of the PVDF-based polymer, a difference of electronegativity between carbon and fluorine is large so that the PVDF-based polymer has a high intensity of polarization. However, as shown in FIG. 2A, a polarization direction in the PVDF-based polymer is the same as a direction in which the back bones of the PVDF-based polymer are disposed by the sum of dipole moments. In addition, the back bone of the PVDF-based polymer is a carbon-carbon bond. That is, since the back bone is composed of carbons, there is no difference in electronegativity between carbon and carbon. As a result, polarization caused by atoms of the back bone cannot be formed.

In contrast, referring to FIG. 2B, in the case of the boron nitride polymer, polarization is formed between atoms composing the back bone due to the difference in electronegativity between nitrogen and boron composing the back bone. The intensity of polarization formed in the back bone of the boron nitride polymer is higher than a sum of the dipole moments in the PVDF-based polymer and thus the entire intensity of polarization is improved. As a result, the piezoelectricity of the boron nitride polymer can be improved.

Further, the linear boron nitride polymer has a high intensity of polarization as compared with a hexagonal boron nitride having a planar structure or a nanotube structure. This will be described with reference to FIGS. 3A to 3C.

Figure 3A:
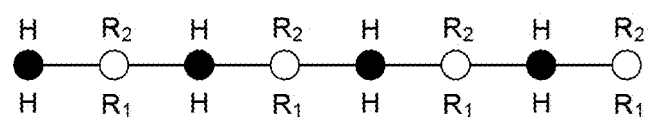
FIG. 3A to 3C are schematic views respectively illustrating structures of a linear boron nitride polymer, a hexagonal boron nitride polymer having a planar structure, and a hexagonal boron nitride polymer having a nanotube structure.
Figure 3B:
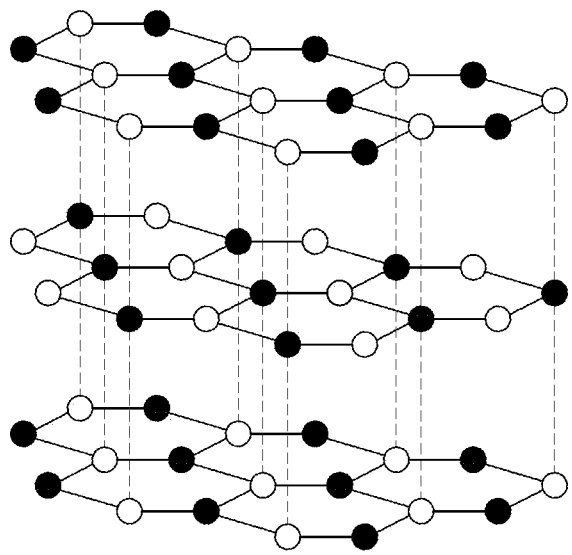
Figure 3C:
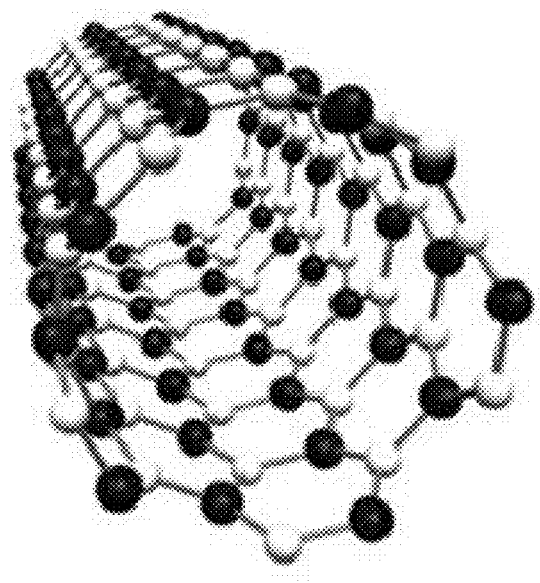

FIGS. 3A to 3C are schematic views respectively illustrating structures of a linear boron nitride polymer, a hexagonal boron nitride polymer having a planar structure, and a hexagonal boron nitride polymer having a nanotube structure. In this case, a black circle illustrated in FIGS. 3A to 3C is a boron atom and a white circle is a nitrogen atom. Specifically, FIG. 3A illustrates a structure of a linear boron nitride polymer, FIG. 3B illustrates a structure of a hexagonal boron nitride polymer having a planar structure, and FIG. 3C illustrates a structure of a hexagonal boron nitride polymer having a nanotube structure.

Referring to FIG. 3A, the linear boron nitride polymer has a straight line shape similar to a chain structure due to a bond structure of nitrogen and boron. When the boron nitride polymer is formed in a straight line, both nitrogen and boron, which form the back bone of each repeating unit, are aligned to substantially the same direction. In this case, as described with reference to FIGS. 2A and 2B, all polarization directions formed in the back bone of each repeating unit match. Therefore, the entire intensity of polarization of the boron nitride polymer can be improved.

Different from FIG. 3A, the hexagonal boron nitride polymer illustrated in FIG. 3B forms a hexagonal ring in which nitrogen and boron forming the back bone are repeated to form a planar structure and has a structure in which a plurality of planar structures is aligned to be laminated. Further, the hexagonal boron nitride polymer illustrated in FIG. 3C entirely forms a carbon nanotube structure in which nitrogen and boron forming the back bone are repeated so that the hexagonal ring is repeated. Like the structures illustrated in FIGS. 3B and 3C, when nitrogen and boron forming the back bone forms a hexagonal ring, polarization directions between nitrogen and boron vary, so that the total intensity of polarization is canceled.

Therefore, when the linear boron nitride polymer and the hexagonal boron nitride polymer are compared, the intensity of polarization of the linear boron nitride polymer is significantly stronger and the vibration strength of the touch sensitive element 100 including the electroactive layer 110 formed of the linear boron nitride polymer is more improved that those of the hexagonal boron nitride polymer.

Specifically, the linear boron nitride polymer composed of the electroactive layer 110 of the touch sensitive element 100 according to the exemplary aspect of the present disclosure may be a compound in which hydrogen is substituted with at least one functional group such as a hydrocarbon group or a halide group on the nitrogen atom. That is, the linear boron nitride polymer may be formed of a repeating unit in which hydrogen of a nitrogen atom disposed in the back bone is substituted with a functional group such as a methyl group.

More specifically, the linear boron nitride polymer which composes the electroactive layer 110 of the touch sensitive element 100 according to the exemplary aspect of the present disclosure may include a repeating unit represented by Chemical Formula 1.

[Chemical Formula 1]

In Chemical Formula 1, $R_1$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_2$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen and x is an arbitrary integer. X may be 100 or larger, but is not limited thereto.

That is, the linear boron nitride polymer which composes the electroactive layer 110 may be formed by a repeating unit in which hydrogen is substituted with at least one functional group such as a hydrocarbon group and a halide group on the nitrogen atom.

In this case, the linear boron nitride polymer which composes the electroactive layer 110 may be a homo polymer formed by only the repeating unit represented by Chemical Formula 1.

In the meantime, another linear boron nitride polymer which composes the electroactive layer 110 may include repeating units represented by Chemical Formula 2.

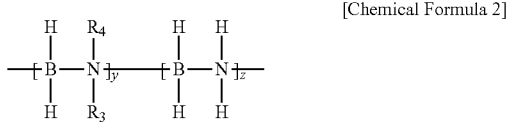

[Chemical Formula 2]

In Chemical Formula 2, $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_4$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen and y and z are arbitrary integers.

That is, the linear boron nitride polymer which composes the electroactive layer 110 may be a polymer simultaneously including a repeating unit in which hydrogen is substituted with at least one functional group such as a hydrocarbon group or a halide group on the nitrogen atom and a repeating unit in which hydrogen is not substituted with the functional group on the nitrogen atom and the boron atom. For example, the linear boron nitride polymer may be a copolymer configured by the repeating unit represented by Chemical Formula 2.

When the linear boron nitride polymer which composes the electroactive layer 110 of the touch sensitive element 100 according to the exemplary aspect of the present disclosure has a structure including a repeating unit in which the hydrogen atom is substituted with a functional group on the nitrogen atom of the back born as represented in Chemical formulae 1 and 2, the touch sensitive element 100 has a high heat resistance.

In regard to this, as compared with the PVDF-based polymer, the PVDF-based polymer has a α-phase in which a fluoro group or a chloro group is disposed in a state in which a trans conformation and a gauche conformation are mixed along the back bone. Therefore, in order to allow the PVDF-based polymer to have electroactivity, the α-phase needs to be transformed to a β-phase in which a fluoro group or a chloro group has all trans conformation by a stretching process or a polling process. This is because when the fluoro groups are aligned in one same direction, the intensity of polarization is maximized. However, the β-phase PVDF-based polymer has a problem in that arrangement of atoms is changed at approximately 80° C. so that the phase returns to the α-phase from the β-phase. That is, in the case of the touch sensitive element 100 including the PVDF-based polymer as the electroactive layer 110, the piezoelectricity is lowered at a predetermined temperature or higher so that vibration strength can also be reduced.

However, the touch sensitive element 100 according to the exemplary aspect of the present disclosure can minimize the reduction of the vibration strength even at the high temperature because the linear boron nitride polymer has a high heat resistance. More specifically, the linear boron nitride polymer used for the touch sensitive element 100 according to the exemplary aspect of the present disclosure has a structure in which hydrogen is substituted with a functional group such as a hydrocarbon group and a halide group on the nitrogen atom of the back bone. For example, as described in detail with reference to FIGS. 2A and 2B, since polarization is formed in the back bone, the linear boron nitride polymer including the repeating unit of Chemical Formula 1 may have uniform and high intensity of polarization without changing the arrangement of atoms by a stretching process or a polling process similar to the PVDF-based polymer. Therefore, since the arrangement of atoms is not changed at 80° C., different from the PVDF-based polymer, the piezoelectricity of the linear boron nitrogen polymer can be maintained at a high temperature.

In the meantime, in the linear boron nitride polymer including the repeating unit of Chemical Formula 2, y may be three or larger times higher than z. When an integer ratio of y and z is three or larger times, the heat resistance of the linear boron nitride polymer is improved so that a lowering rate of the piezoelectricity at a temperature of 80° C. or higher is significantly decreased. Therefore, the vibration acceleration of the touch sensitive element 100 can be maintained even at a high temperature.

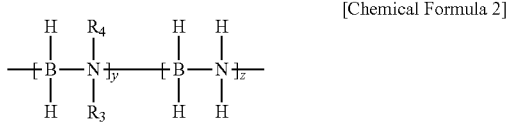

[Chemical Formula 2]

More specifically, when a ratio of the repeating unit in which hydrogen is not substituted with a functional group such as a hydrocarbon group and a halide group on nitrogen is high, the heat resistance can be lowered. For example, like the linear boron nitride polymer formed by a repeating unit represented by the following Chemical Formula 3, in a structure in which only hydrogen atoms are connected to boron and nitrogen of a back born, a hydrogen atom of boron and a hydrogen atom of nitrogen which are adjacent to each other may be debonded at approximately 110° C. to generate a hydrogen gas ($H_2$) and an energy stable hexagonal ring as illustrated in FIGS. 3B and 3C is formed. As a result, the linear boron nitride polymer is deformed to a hexagonal boron nitride polymer at a high temperature, as described above, so that the intensity of polarization is canceled and the piezoelectricity is significantly reduced.

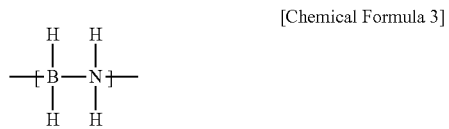

[Chemical Formula 3]

However, the touch sensitive element of the present disclosure includes a linear boron nitride polymer in which hydrogen is not substituted with a functional group such as a hydrocarbon group and a halide group on nitrogen of a back bone, similar to the linear boron nitride polymer including the repeating unit represented by Chemical Formula 1 or 2. In this case, the substituted hydrocarbon group or halide group on nitrogen may suppress the linear boron nitride polymer from being transformed to the hexagonal boron nitride polymer while debonding the hydrogen atom connected to boron and nitrogen at a high temperature. That is, a linear structure may be maintained even at a high temperature.

As described above, in the case of the electroactive layer 110 of the touch sensitive element 100 of the present disclosure, a rate of change of a vibration acceleration measured at 110° C. with respect to a vibration acceleration measured at 25° C. may be less than 10-50%. The rate of change of the vibration acceleration of the electroactive layer formed of the PVDF-based polymer having a high permittivity as a ferroelectric polymer is approximately 70% under the same condition. Accordingly, it is considered that the heat resistance of the electroactive layer 110 of the touch sensitive element 100 of the present disclosure is significantly improved.

Further, When the linear boron nitride polymer which composes the electroactive layer 110 of the touch sensitive element 100 according to the exemplary aspect of the present disclosure has a structure including a repeating unit in which hydrogen is substituted with a functional group on the nitrogen atom of the back born as represented in Chemical Formulae 1 and 2, a solubility of the linear boron nitride polymer can be improved. As the solubility of the linear boron nitride polymer is improved, the electroactive layer 110 can be more readily formed by using a solution casting method.

Even though it is not limited thereto, in the repeating unit represented in Chemical Formulae 1 and 2, the number of carbon atoms of $R_1$, $R_2$, $R_3$, and $R_4$ which are substituted functional groups on nitrogen may be 5 or less. When the number of carbon atoms of the substituted group is 5 or less, the solubility of the linear boron nitride polymer becomes excellent so that it is easy to form the electroactive layer using the solution casting method and the piezoelectricity of the formed electroactive layer may be improved.

Even though the linear boron nitride polymer is not limited thereto, a weight average molecular weight may be 10,000 to 1,000,000 and may be 100,000 to 500,000. When the weight average molecular weight of the linear boron nitrogen polymer satisfies the above range, it is easy to form the electroactive layer as a film and achieve excellent piezoelectricity.

In the meantime, a thickness of the electroactive layer 110 may be determined such that the touch sensitive element 100 generates a sufficient vibration with a low driving voltage. For example, the thickness of the electroactive layer 110 may be 1 μm to 30 μm, or may be 1 μm to 15 μm. When the thickness of the electroactive layer 110 satisfies the above ranges, the electroactive layer 110 may be formed using the linear boron nitride polymer without causing a crack and generates sufficient vibration.

As described above, the touch sensitive element according to the exemplary aspect of the present disclosure has excellent vibration strength and heat resistance. Specifically, the linear boron nitride polymer which configures the electroactive layer has a high intensity of polarization according to a structural characteristic so that the piezoelectricity of the electroactive layer is improved. Further, as compared with the PVDF-based polymer and the hexagonal boron nitride polymer, change of a structure of the linear boron nitride polymer is suppressed even at a high temperature so that the heat resistance is improved. In the meantime, the linear boron nitride polymer has a high transmittance similar to the PVDF-based polymer, to be disposed on a front surface of the display device.

Hereinafter, a method of composing a linear boron nitride polymer which configures an electroactive layer of a touch sensitive element of the present disclosure will be described.

First, a monomer is composed (S100).

For example, when a linear boron nitride homopolymer (first polymer) including only the repeating unit represented by Chemical Formula 1 is formed, a first monomer in which a substituent group is formed on a nitrogen atom is prepared. Different from this, when a linear boron nitride copolymer (second polymer) including the repeating unit represented by Chemical Formula 2 is formed, the first monomer in which a substituent group is formed on a nitrogen atom and the second monomer in which a substituent group is not formed on the nitrogen atom are prepared.

A composite reaction formula of the first monomer in which the substituent group is formed on the nitrogen atom is as follows.

In the meantime, a composite reaction formula of the second monomer in which the substituent group is not formed on the nitrogen atom is as follows.

The composed monomer is polymerized (S200).

When a homopolymer (first polymer) including only a repeating unit in which a substituent group is formed on the nitrogen atom is formed, only the produced first monomer is polymerized. Specifically, a polymerization reaction formula of the first polymer is as follows.

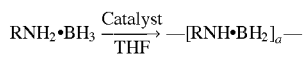

When a copolymer (second polymer) simultaneously including a repeating unit in which a substituent group is formed on the nitrogen atom and a repeating unit in which a substituent group is not formed on the nitrogen atom is formed, the produced first monomer and second monomer are polymerized. Specifically, a polymerization reaction formula of the second polymer is as follows.

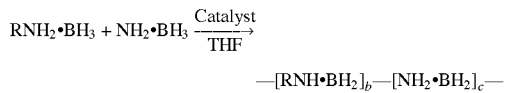

In the meantime, a catalyst used in a polymerization reaction is an iridium-based catalyst, (ρ-HPCP)IrH$_2$. Even though it is not limited thereto, a composing method of a catalyst used in the present disclosure is as follows.

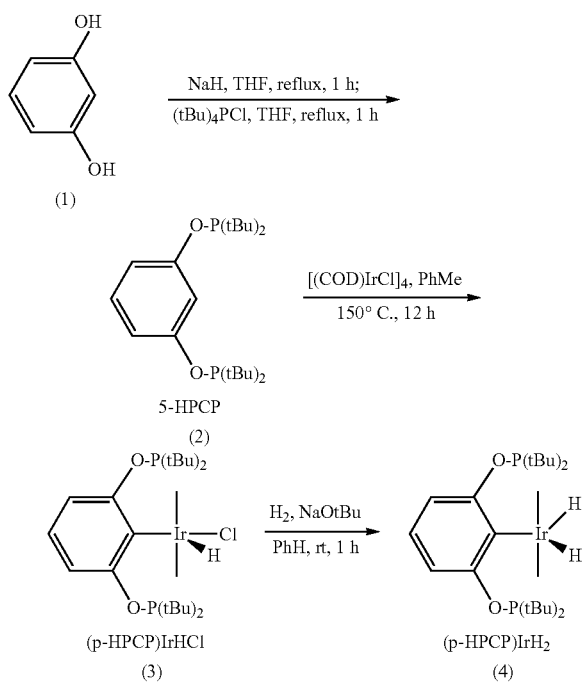

In the meantime, the linear boron nitride polymer of the present disclosure may be stably obtained according to the above-described producing method. Generally, in order to produce the PVDF-based polymer, a process of polymerizing 1,1-difluoroethylene (VDF) and benzonyl peroxide needs to be performed. However, it is difficult to perform polymerization due to high explosibility. However, a monomer for producing the linear boron nitride polymer of the present disclosure is in a liquid state so that a risk of explosion is much low during the polymerization. Therefore, the linear boron nitride polymer can be safely obtained.

Hereinafter, an effect of the present disclosure related to the above-described heat resistance will be described through Examples. However, the following Examples are set forth to illustrate the present disclosure, but the scope of the present disclosure is not limited thereto.

Example 1

A linear boron nitride polymer represented by Chemical Formula 4 is composed to make a ratio of a repeating unit in which the nitrogen atom has a substituted methyl group and a repeating unit in which the nitrogen atom does not have a substituted methyl group to be 10:1.

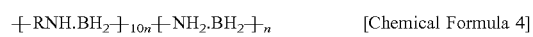
[Chemical Formula 4]

After dissolving the composed linear boron nitride polymer in a dimethylformamide (DMF) solvent, an electroactive layer with a thickness of 10 um is formed on a lower electrode using a solution casting method and then an upper electrode is deposited thereto to form a touch sensitive element.

Example 2

The touch sensitive element is manufactured by the same method as Example 1 except that a linear boron nitride polymer represented by Chemical Formula 5 is used to make a ratio of a repeating unit in which a nitrogen atom has a substituted methyl group and a repeating unit in which a nitrogen atom does not have a substituted methyl group to be 3:1.

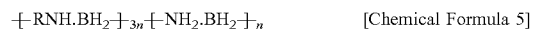
[Chemical Formula 5]

Comparative Example

A PVDF homopolymer (solef 6020, Solvay) is subjected to coextrusion to be formed as a film and then uniaxially stretched. A polling process of 100 V/um is performed on the stretched PVDF film to form a PVDF film with a thickness of 10 um. Thereafter, an upper electrode and a lower electrode are deposited on both surfaces of the PVDF film to form a touch sensitive element.

Experimental Example 1—Evaluate Heat Resistance of Touch Sensitive Element

In touch sensitive elements according to Example 1, Example 2, and Comparative Example 1, a first vibration acceleration when AC voltages of 100 V, 200 V, 300 V, 400 V, and 500 V at 100 Hz are applied to the electroactive layer through the upper electrode and the lower electrode under the condition of 25° C. is measured. Thereafter, the manufactured touch sensitive element is stored at 80° C. and 110° C. for 24 hours and then a second vibration acceleration when the same AC voltages are applied is measured to measure a rate of change of the vibration acceleration. The rate of change of the vibration acceleration of the touch sensitive element after being stored at 80° C. corresponding to each of voltages is filled in Table 1 and a rate of change of the vibration acceleration after being stored at 110° C. is filled in Table 2.

TABLE 1

| Classification | Example 1 | Example 2 | Comparative Example |
|---|---|---|---|
| Rate (%) of change at 100 V | 0 | 12.32 | 56.10 |
| Rate (%) of change at 200 V | 0 | 9.68 | 53.03 |
| Rate (%) of change at 300 V | 0 | 20.46 | 57.14 |
| Rate (%) of change at 400 V | 0 | 17.74 | 44.80 |
| Rate (%) of change at 500 V | 0 | 12.32 | 56.10 |

TABLE 2

| Classification | Example 1 | Example 2 | Comparative Example |
|---|---|---|---|
| Rate (%) of change at 100 V | 0 | 33.33 | 81.25 |
| Rate (%) of change at 200 V | 0 | 34.78 | 80.49 |
| Rate (%) of change at 300 V | 0 | 48.39 | 72.73 |
| Rate (%) of change at 400 V | 0 | 47.73 | 66.34 |
| Rate (%) of change at 500 V | 0 | 51.61 | 67.20 |

As shown in Table 1, a rate of change of a vibration acceleration of the touch sensitive element including an electroactive layer formed of a PVDF-based polymer after being stored at 80° C. is 40% or higher. Further, as shown in Table 2, a rate of change of a vibration acceleration after being stored at 110° C. is approximately 60% or higher. That is, the arrangement of the PVDF-based polymer is changed under a high temperature condition so that the intensity of polarization is significantly reduced. However, a rate of change of a vibration acceleration of the touch sensitive element after being stored at 80° C. is 20% or lower and a rate of change of a vibration acceleration after being stored at 110° C. is approximately 50% or lower. Therefore, it is confirmed that the heat resistance of the linear boron nitride polymer is much better than that of the PVDF-based polymer.

Specifically, in the case of Example 1 in which a ratio of the repeating unit in which the nitrogen atom has a substituted methyl group and the repeating unit in which the nitrogen atom does not have a substituted methyl group is 10:1, it is confirmed that even though the touch sensitive element is stored at 110° C., the vibration acceleration is never reduced.

Display Device

Figure 4:
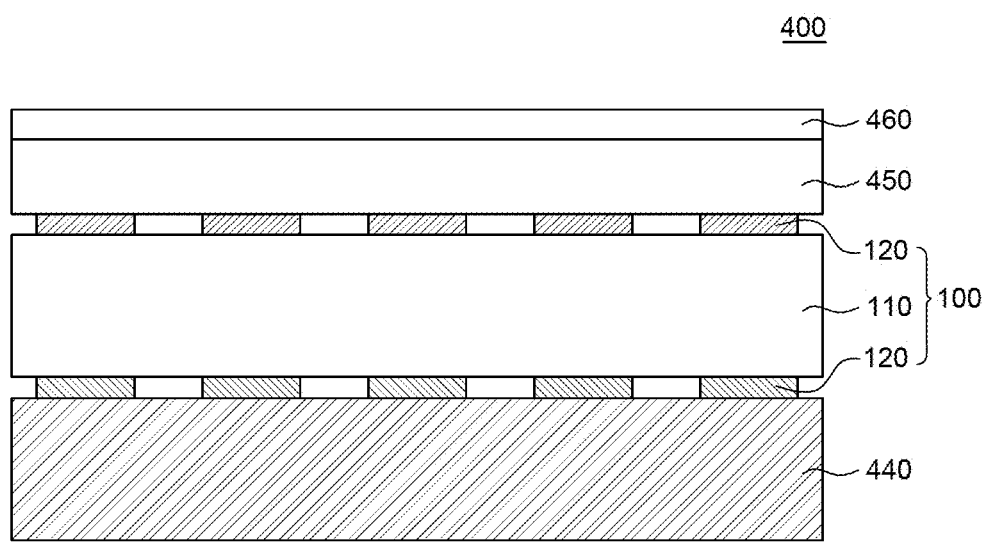
FIG. 4 is a schematic cross-sectional view illustrating a display device including a touch sensitive element according to an exemplary aspect of the present disclosure.

FIG. 4 is a schematic cross-sectional view illustrating a display device including a touch sensitive element according to an exemplary aspect of the present disclosure. Referring to FIG. 4, a display device 400 includes a display panel 440, a contact sensitive device 100, a touch panel 450, and a cover 460. In this case, the touch sensitive element 100 included in the display device 400 of FIG. 4 is the same as the touch sensitive element 100 according to the exemplary aspect of the present disclosure which has been described with reference to FIG. 1. Therefore, a redundant description of the touch sensitive element 100 will be omitted.

The display panel 440 refers to a panel in which a display element for displaying an image in the display device 400 is disposed. As the display panel 440, for example, various display panels such as an organic light emitting display panel, a liquid crystal display panel, and an electrophoretic display panel may be used.

The touch sensitive element 100 including an electroactive layer 110 formed of a linear boron nitride polymer and an electrode 120 is disposed on the display panel 440. Hereinafter, it will be described that the touch sensitive element illustrated in FIG. 4 is the touch sensitive element 100 illustrated in FIG. 1. Specifically, the touch sensitive element 100 includes an electroactive layer 110 formed of a linear boron nitride polymer and an electrode 120 formed on at least one surface of the electroactive layer 110.

The touch panel 450 is disposed on the touch sensitive element 100. The touch panel 450 refers to a panel which senses a user's touch input to the display device 400. As the touch panel 450, for example, a capacitive type, a resistive type, an ultrasonic type, or an infrared type may be used, but desirably, a capacitive type touch panel may be used as the touch panel 450. The display device 400 illustrated in FIG. 4 includes an add-on type touch panel 450 in which a separately manufactured touch panel 450 is separately disposed on the display panel 440.

A cover 460 is disposed on the touch panel 450. The cover 460 is to protect the display device from an impact from the outside of the display device 400. The cover 460 may be formed of a transparent insulating material.

Even though not illustrated in FIG. 4, an adhesive layer may be used to bond the display panel 440, the touch sensitive element 100, the touch panel 450, and the cover 460 to each other. As the adhesive layer, for example, an optical clear adhesive (OCA) or an optical clear resin (OCR) may be used, but the adhesive layer is not limited thereto.

The display device according to an exemplary aspect of the present disclosure includes a touch sensitive element which is transparent and has improved vibration strength, and improved heat resistance, similarly to the touch sensitive element including the electroactive layer configured by a PVDF-based polymer.

Figure 5:
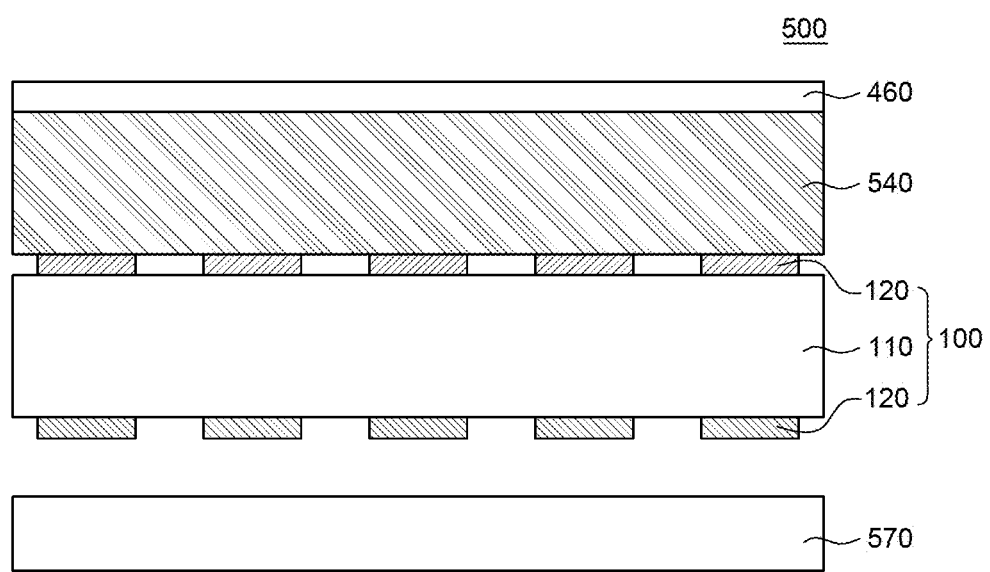
FIG. 5 is a schematic cross-sectional view illustrating a display device including a touch sensitive element according to another exemplary aspect of the present disclosure.

FIG. 5 is a schematic cross-sectional view illustrating a display device including a touch sensitive element according to another exemplary aspect of the present disclosure. When a display device 500 illustrated in FIG. 5 is compared with the display device 400 which has been described with reference to FIG. 4, except that the display panel 540 is a liquid crystal display panel and thus a backlight unit is further included and an in-cell type touch sensor in which a touch sensor other than the separate touch panel is provided to be integrated with the display panel 540, other components are substantially the same, so that the redundant description will be omitted.

Referring to FIG. 5, the display panel 540 is disposed between the cover 460 and the touch sensitive element 100. The liquid crystal display panel displays an image by adjusting transmittance of the light emitted from the backlight unit 570. The liquid display panel includes a lower polarizer, a lower substrate including a thin film transistor (TFT), a liquid crystal layer, an upper substrate including a color filter, and an upper polarizer, but is not limited thereto.

The display panel 540 is a panel in which a display device for displaying an image in the display device 500 is disposed and includes a touch sensor integrated in the panel. That is, the touch sensor is disposed in the display panel 540 to compose an in-cell type touch sensor. In the in-cell type touch sensor, a common electrode of the display panel 540 is simultaneously used as a touch electrode.

Since the display device 500 illustrated in FIG. 5 is a liquid crystal display device, so that a backlight unit 570 which emits light toward the display panel 540 is disposed below the display device 540.

Between the display panel 540 and the backlight unit 570, the touch sensitive element 100 including an electroactive layer 110 formed of a linear boron nitride polymer and an electrode 120 is disposed.

Generally, when the display panel is a liquid crystal display panel and an in-cell type touch sensor is integrated with the display panel, if the touch sensitive element is disposed on the touch sensor, the touch input may be erroneously recognized due to a noise which may be generated by a high driving voltage applied to the touch sensitive element. Therefore, the touch sensitive element may be disposed below the display panel. However, when the touch sensitive element is disposed below the display panel, since the user is located far away from the position to which the touch input is applied, the vibration strength transmitted to the user is reduced. Therefore, in order to minimize the reduction of the vibration strength, it is considered to dispose the touch sensitive element between the liquid crystal display panel and the backlight unit. However, as described above, there is a problem in that the shape memory alloy or the piezoelectric ceramics used in the contact-sensitive device of the related art has low light transmittance. However, in the display device 500 according to another exemplary aspect of the present disclosure, the touch sensitive element including an electroactive layer formed of a linear boron nitride polymer is disposed so that transparency is excellent and vibration strength is improved. Therefore, even though the touch sensitive element 100 is disposed between the liquid crystal display panel and the backlight unit, the light transmittance of the light supplied from the backlight unit to the liquid crystal display panel is excellent and stronger vibration may be transmitted than in the case of using the electroactive polymer in the related art.

The exemplary aspects of the present disclosure can also be described as follows:

According to an aspect of the present disclosure, a touch sensitive element includes an electroactive layer formed of a linear boron nitride polymer; and an electrode which is disposed on at least one surface of the electroactive layer.

In the boron nitride polymer, a nitrogen atom may have a substituted hydrocarbon group or halide group.

The linear boron nitride polymer may include a repeating unit represented by the following Chemical Formula 1.

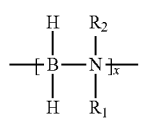

[Chemical Formula 1]

(In Chemical Formula 1, $R_1$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_2$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen and x is an arbitrary integer.)

The linear boron nitride polymer may include a repeating unit represented by the following Chemical Formula 2.

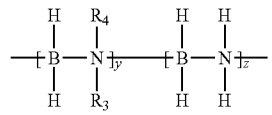

[Chemical Formula 2]

(In Chemical Formula 2, $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_4$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen and y and z are arbitrary integers.)

y may be three or larger times larger than z.

The number of carbon atoms of $R_1$, $R_2$, $R_3$, and $R_4$ may be 5 or less.

An intensity of polarization of the linear boron nitride polymer may be 0.2 $C/m^2$ or higher.

A weight average molecular weight of the linear boron nitride polymer may be 100000 or higher.

According to another aspect of the present disclosure, a touch sensitive element includes an electroactive layer formed of a boron nitride polymer; and an electrode which is disposed on at least one surface of the electroactive layer, in which a rate of change of a vibration acceleration measured at 100° C. with respect to a vibration acceleration measured at 25° C. is 50% or lower.

A back bone of the boron nitride polymer may be linear polymer having a boron atom and a nitrogen atom.

In the boron nitride polymer, a nitrogen atom may have a substituted hydrocarbon group or halide group.

According to yet another aspect of the present disclosure, a display device includes a display panel and a touch sensitive element above or below the display panel in which the touch sensitive element includes an electroactive layer formed of a linear boron nitride polymer and an electrode disposed on at least one surface of the electroactive layer.

The linear boron nitride polymer includes a repeating unit represented by the following Chemical Formula 1.

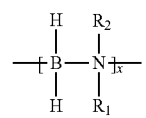

[Chemical Formula 1]

(In Chemical Formula 1, $R_1$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_2$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen and x is an arbitrary integer.)

The display device may further include an add-on type touch panel which is separately disposed on the display panel and the touch sensitive element may be disposed between the display panel and the touch panel.

The display panel may be a liquid crystal display panel including a touch sensor which is integrated in the display panel, a backlight unit disposed below the liquid crystal display panel may be further included, and the touch sensitive element may be disposed between the liquid crystal display panel and the backlight unit.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical spirit of the present disclosure. The scope of the technical spirit of the present disclosure is not limited thereto. The protective scope of the present disclosure should be construed based on the following claims, and all the technical concepts in the equivalent scope thereof should be construed as falling within the scope of the present disclosure.

What is claimed is:

1. A display device, comprising:
a display panel configured to display an image; and
a touch sensitive element on an upper surface or a lower surface of the display panel,
wherein the touch sensitive element includes an electroactive layer formed of a linear boron nitride polymer and an electrode on at least one surface of the electroactive layer, to apply an electric field to the electroactive layer to generate vibration;
wherein the linear boron nitride polymer comprises a repeating unit represented by Chemical Formula 1,

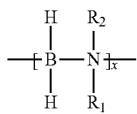

[Chemical Formula 1]

where $R_1$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_2$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen, and x is an integer of 100 or larger.

2. The display device of claim 1, further comprising:
an add-on type touch panel on the display panel, wherein the touch sensitive element is between the display panel and the touch panel.

3. The display device of claim 1, wherein:
the display panel includes a liquid crystal display panel having a touch sensor integrated in the display panel, and a backlight unit below the liquid crystal display panel; and
the touch sensitive element is between the liquid crystal display panel and the backlight unit.

4. The display device of claim 3, further comprising:
a cover on the touch sensor,
wherein the display panel is between the cover and the touch sensitive element.

5. The display device of claim 1, further comprising:
a touch panel on the touch sensitive element; and
a cover on the touch panel.

6. The display device of claim 1, wherein:
the display panel includes a touch sensor integrated in the display panel; and the touch sensitive element is disposed below the display panel.

7. The display device of claim 1, wherein the electrode is on an upper surface of the electroactive layer and a lower surface of the electroactive layer.

8. The display device of claim 1, wherein the electrode includes a plurality of electrodes on one of an upper surface and a lower surface of the electroactive layer.

9. The display device of claim 1, wherein the electrode includes a plurality of electrodes on an upper surface of the electroactive layer and a lower surface of the electroactive layer.

10. The display device of claim 1, wherein the electrode on an upper surface of the electroactive layer extends in an X-axis direction and the electrode on a lower surface of the electroactive layer extends in a Y axis direction.

11. The display device of claim 1, wherein the electrode is formed of a conductive material.

12. The display device of claim 1, wherein the linear boron nitride polymer comprises a repeating unit represented by Chemical Formula 2,

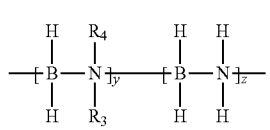

[Chemical Formula 2]

where $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_4$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen, and y and z are arbitrary integers.

13. The display device of claim 12, wherein y is at least three times greater than z.

14. The display device of claim 12, wherein the number of carbon atoms of each of $R_1$, $R_2$, $R_3$, and $R_4$ is 5 or less.

15. The display device of claim 1, wherein the linear boron nitride polymer has an intensity of polarization of 0.2 $C/m^2$ or higher.

16. The display device of claim 1, wherein the linear boron nitride polymer has a weight average molecular weight of 100000 or higher.

17. The display device of claim 1, wherein the linear boron nitride polymer is formed from a linear boron nitride polymer represented by Chemical Formula 4, having a ratio of a repeating unit in which the nitrogen atom has a substituted methyl group (R) and a repeating unit in which the nitrogen atom does not have a substituted methyl group (R) of 10:1,

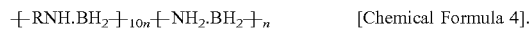 [Chemical Formula 4].

18. The display device of claim 17, wherein the linear boron nitride polymer represented by Chemical Formula 4 is dissolved in a dimethylformamide (DMF) solvent to form the electroactive layer by a solution casting method.

19. The display device of claim 1, wherein the linear boron nitride polymer is formed from a linear boron nitride polymer represented by Chemical Formula 5, having a ratio of a repeating unit in which a nitrogen atom has a substituted methyl group (R) and a repeating unit in which a nitrogen atom does not have a substituted methyl group (R) of 3:1,

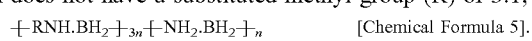 [Chemical Formula 5].

20. The display device of claim 19, wherein the linear boron nitride polymer represented by Chemical Formula 5 is dissolved in a dimethylformamide (DMF) solvent to form the electroactive layer by a solution casting method.

21. A touch sensitive element, comprising:

an electroactive layer formed of a linear boron nitride polymer; and an electrode disposed on at least one surface of the electroactive layer, to apply an electric field to the electroactive layer to generate vibration;

wherein the linear boron nitride polymer comprises a repeating unit represented by Chemical Formula 1,

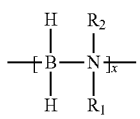

[Chemical Formula 1]

where $R_1$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group or a halide group, and $R_2$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, a halide group or hydrogen, and x is an integer of 100 or larger, and wherein the touch sensitive element has a rate of change of a vibration acceleration measured at 110° C. that is equal to or less than 50% of a rate of change of a vibration acceleration measured at 25° C.

22. The touch sensitive element of claim 21, wherein the electrode is on an upper surface of the electroactive layer and a lower surface of the electroactive layer.

23. The touch sensitive element of claim 21, wherein the electrode includes a plurality of electrodes on an upper surface of the electroactive layer and a lower surface of the electroactive layer.

24. The touch sensitive element of claim 21, wherein the electrode on an upper surface of the electroactive layer extends in an X-axis direction and the electrode on a lower surface of the electroactive layer extends in a Y axis direction.

25. The touch sensitive element of claim 21, wherein the electrode is formed of a conductive material.

* * * * *